US012628355B2

(12) United States Patent
Chuang

(10) Patent No.: US 12,628,355 B2
(45) Date of Patent: May 12, 2026

(54) CAPACITOR STRUCTURE AND METHOD FOR FABRICATING THE SAME

(71) Applicant: Nanya Technology Corporation, New Taipei City (TW)

(72) Inventor: Da-Zen Chuang, Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 1008 days.

(21) Appl. No.: 17/836,579

(22) Filed: Jun. 9, 2022

(65) Prior Publication Data

US 2023/0402502 A1    Dec. 14, 2023

(51) Int. Cl.
| | |
|---|---|
| *H10D 1/00* | (2025.01) |
| *H10B 12/00* | (2023.01) |
| *H10D 1/68* | (2025.01) |
| *H10P 52/40* | (2026.01) |
| *H10P 95/00* | (2026.01) |

(52) U.S. Cl.
CPC ............. *H10D 1/042* (2025.01); *H10B 12/00* (2023.02); *H10D 1/716* (2025.01); *H10P 52/403* (2026.01); *H10P 95/062* (2026.01)

(58) Field of Classification Search
CPC .. H10D 1/042; H10D 1/716; H01L 21/31053; H01L 21/3212; H10B 12/00; H10B 12/033

See application file for complete search history.

(56) References Cited

U.S. PATENT DOCUMENTS

2022/0359645 A1 * 11/2022 Lai .......................... H01G 4/228

* cited by examiner

*Primary Examiner* — Fernando L Toledo
*Assistant Examiner* — Jorge Andres Lopez
(74) *Attorney, Agent, or Firm* — Birch, Stewart, Kolasch & Birch, LLP

(57) ABSTRACT

This invention provides a capacitor structure includes a U-shaped bottom electrode having a cap dielectric provided at its open end, a top electrode and a capacitor dielectric layer interposed between the bottom electrode and the top electrode to constitute an outer capacitor around a cylinder type solid inner capacitor, and the outer capacitor and the inner capacitor are divided by the cap dielectric. The cylinder type solid inner capacitor and the outer capacitor are fabricated separately so that the cylinder type solid inner capacitor may support its own weight to prevent its structure from being damaged during the fabrication of the capacitor.

7 Claims, 8 Drawing Sheets

307

306a
305a 304
302

301
300

304b
306a
305a
304a
302

301
300

308

306a
305a
304a
302

301
300

307a 308a
306a
305a
304a
302

301
300

308a
306a
305a
304a 301
300

308a
306a
305a
304a
306b 305b
301
300

308a
306a
305a
304a
306b 305b
301
300

309

308a
306a
305a
304a
306

305b
301
300

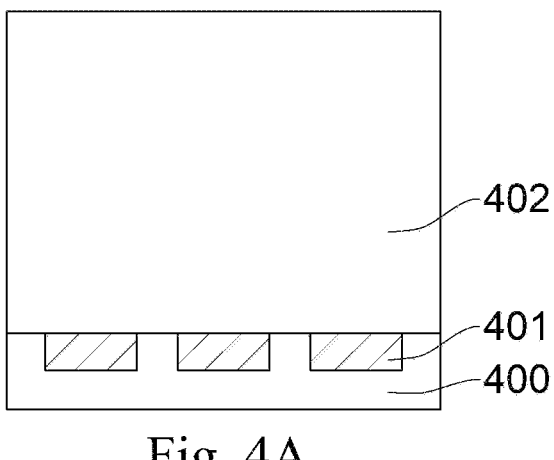
402
401
400
Fig. 4A
403
402
401
400
Fig. 4B
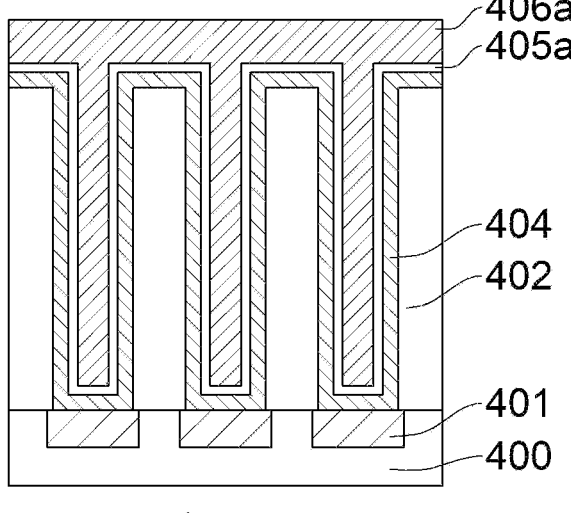
406a
405a
404
402
401
400
Fig. 4C

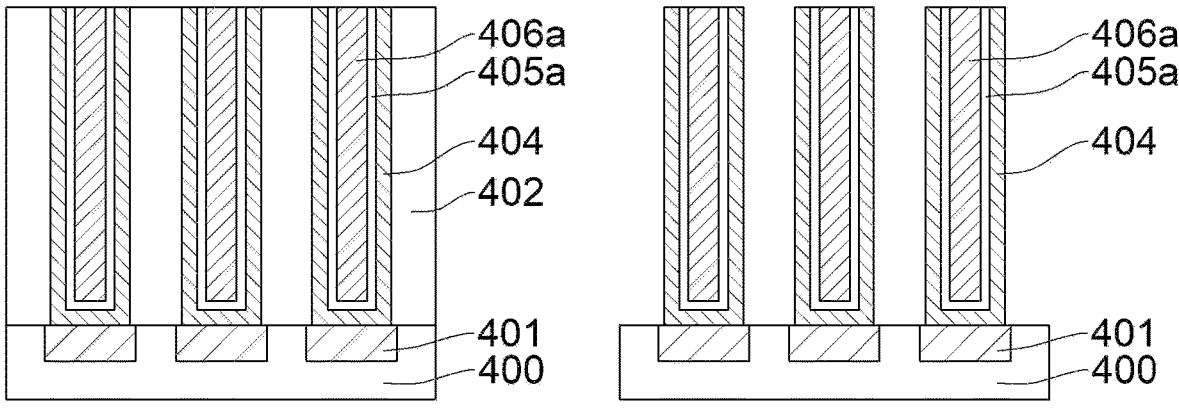
Fig. 4D                    Fig. 4E
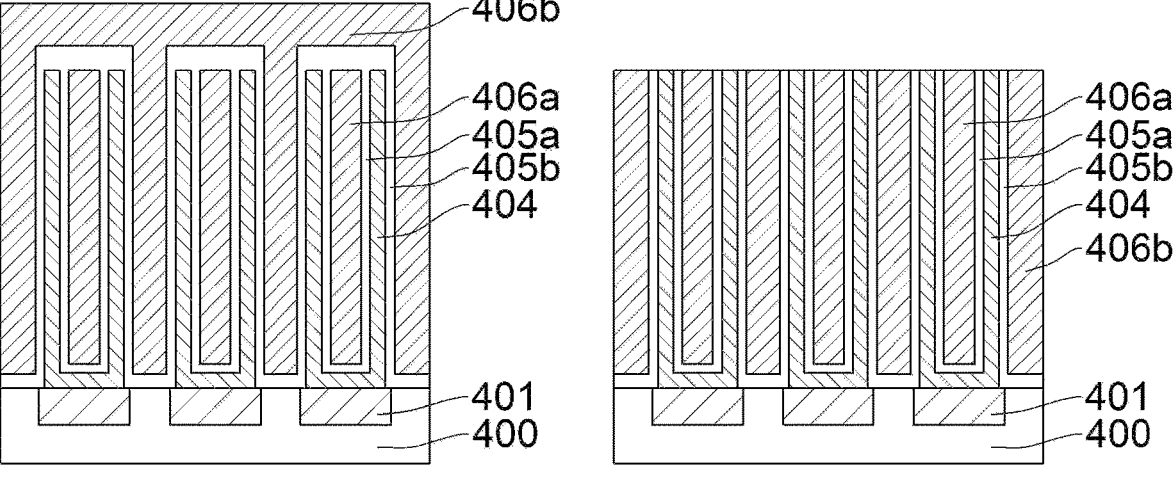
Fig. 4F                    Fig. 4G

CAPACITOR STRUCTURE AND METHOD FOR FABRICATING THE SAME

BACKGROUND OF THE INVENTION

Field of the Invention

The present invention relates to the field of semiconductor process, and more particularly to a method for fabricating a capacitor structure for DRAM with crown capacitors.

Description of the Prior Art

With technology continuously migrating to advanced nodes, fabrication of DRAM capacitors is getting tougher. In order to enlarge total surface area of a capacitor to maximize the charge storing for capacitance, crown capacitors have been used for a long time to fully utilize both inner and outer areas of the capacitor. FIG. 1 shows a schematic cross sectional view of partially produced crown capacitors 10, in which an array of bottom electrodes 104 are provided on a substrate 100. Each of the bottom electrodes 104 is aligned over one of conductive landing pads 102 of the substrate 100. A capacitor dielectric layer 106 is conformally deposited on the bottom electrode 104. With technology moving to more advanced node, further shrinking of crown capacitors 10 is facing the issue that the crown capacitors 10 is not rigid nor strong enough to support its own weight and is likely to bend or even to fall during its fabrication process. This may result in short circuit of capacitor-to-capacitor, and causing the function failure of the resulted device. See FIG. 2, for example, the bottom electrodes 104 may become much thinner and bending to abut each other as the ratio of the bottom width to the height of the crown capacitor 100 is increasingly reduced. Therefore, it is difficult to form these fragile free standing capacitor bottom electrodes 104 without resulting in damage during subsequent processing.

There is still a need in the semiconductor industry to provide crown capacitors having increased uniform capacitance among individual memory cells while reducing the susceptibility to process damage subsequent to making the capacitor bottom electrodes.

SUMMARY OF THE INVENTION

The present invention proposes a novel capacitor structure and its fabrication method to resolve the issue described above.

The novel capacitor structure includes a U-shaped bottom electrode having a cap dielectric provided at its open end, a top electrode and a capacitor dielectric layer interposed between the bottom electrode and the top electrode to constitute an outer capacitor around a cylinder type solid inner capacitor, and the outer capacitor and the cylinder type solid inner capacitor are divided by the cap dielectric. In its fabrication process, the cylinder type solid inner capacitor and the outer capacitor are fabricated separately so that the cylinder type solid inner capacitor may support its own weight to prevent its structure from bending and/or falling during the fabrication of the capacitors.

The present invention also provides a capacitor structure for DRAM with crown capacitors, which includes an array of capacitor cells, each of the capacitor cells is configured to include a U-shaped bottom electrode having a cap dielectric provided at its open end, a top electrode and a capacitor dielectric layer interposed between the bottom electrode and the top electrode to constitute an outer capacitor around a cylinder type solid inner capacitor, and the outer capacitor and the cylinder type solid inner capacitor are divided by the cap dielectric.

To obtain the above capacitor structure, in one embodiment, the present invention provides a method for fabricating a capacitor structure with crown capacitors. A substrate having an array of conductive landing pads is provided. A first dielectric layer is formed on the substrate and then forming a plurality of trenches in the first dielectric layer to expose the conductive landing pads, each of the trenches aligned over one of the conductive landing pads. A bottom electrode layer is conformally formed on the first dielectric layer and a first capacitor dielectric layer is conformally formed on the bottom electrode layer. A first top electrode layer is formed on the first capacitor dielectric layer so that the first capacitor dielectric layer is interposed between the first top electrode layer and the bottom electrode layer. A first chemical mechanical polish process is performed until the first dielectric layer, the bottom electrode layer, the first capacitor dielectric layer and the first top electrode layer are coplanar, whereby an array of cylinder type solid inner capacitor predecessors are provided and each of the inner capacitor predecessors is aligned over one of the conductive landing pads, and each of the inner capacitor predecessors comprises the bottom electrode layer, the first top electrode layer and the first capacitor dielectric layer interposed between the bottom electrode layer and the first top electrode layer. Then, removing a portion of the bottom electrode layer to form an array of bottom electrodes and an array of recesses aligned over the bottom electrodes. A cap dielectric layer is then deposited to fill the recesses. Afterward, a second chemical mechanical polish process is performed until the first dielectric layer, the cap dielectric layer, the first capacitor dielectric layer and the first top electrode layer are coplanar, whereby an array of cylinder type solid inner capacitors are provided, each of the inner capacitors having the cap dielectric on one end of the bottom electrode opposing the conductive landing pad. Thereafter, the first dielectric layer is removed and the cylinder type solid inner capacitors are freestanding on the substrate. A second capacitor dielectric layer is conformally formed on the inner capacitors. A second top electrode layer is formed on the second capacitor dielectric layer so that the second capacitor dielectric layer is interposed between the second top electrode layer and the bottom electrode. A third chemical mechanical polish process is performed until the first top electrode layer, the second top electrode layer, the cap dielectric, the first capacitor dielectric layer and the second capacitor dielectric layer are coplanar so as to form an array of outer capacitors, whereby an array of crown capacitors is provided, each of the crown capacitors comprises one of the outer capacitors around one of the cylinder type solid inner capacitors.

In another embodiment, the present invention provides a method for fabricating a capacitor structure with crown capacitors. A substrate having an array of conductive landing pads is provided. A first dielectric layer is formed on the substrate. A plurality of trenches is formed in the first dielectric layer to expose the conductive landing pads, each of the trenches aligned over one of the conductive landing pads. A bottom electrode layer is conformally formed on the first dielectric layer. A first capacitor dielectric layer is conformally formed on the bottom electrode layer. Then, a first top electrode layer is formed on the first capacitor dielectric layer so that the first capacitor dielectric layer is interposed between the first top electrode layer and the bottom electrode layer. A first chemical mechanical polish process is performed until the first dielectric layer, the bottom electrode layer, the first capacitor dielectric layer and the first top electrode layer are coplanar, whereby an array of cylinder type solid inner capacitor predecessors are provided and each of the inner capacitor predecessors is provided and each of the inner capacitor predecessors is aligned over one of the conductive landing pads, and each of the inner capacitor predecessors comprises the bottom electrode layer, the first top electrode layer and the first capacitor dielectric layer interposed between the bottom electrode layer and the first top electrode layer. Then, the first dielectric layer is removed and the cylinder type solid inner capacitor predecessors are freestanding on the substrate. A second capacitor dielectric layer is conformally formed on the inner capacitor predecessors. A second top electrode layer is formed on the second capacitor dielectric layer. Then, a second chemical mechanical polish process is performed until the first top electrode layer, the second top electrode layer, the first capacitor dielectric layer, the second capacitor dielectric layer and the bottom electrode layer are coplanar. Afterward, removing a portion of the bottom electrode layer to form an array of bottom electrodes and an array of recesses aligned over the bottom electrodes. Then, a cap dielectric layer is deposited to fill the recesses. A third chemical mechanical process is performed until the first top electrode layer, the second top electrode layer, the first capacitor dielectric layer, the second capacitor dielectric layer and the cap dielectric layer are coplanar so that an array of crown capacitors are provided, each of the crown capacitors comprises an outer capacitor around one of the cylinder type solid inner capacitors, the outer capacitor has the second capacitor dielectric layer interposed between the second top electrode layer and the bottom electrode, the inner capacitor has the first capacitor dielectric layer interposed between the first top electrode layer and the bottom electrode, and the cap dielectric layer is provided at one end of the bottom electrode opposing the conductive landing pad.

BRIEF DESCRIPTION OF THE DRAWINGS

Other objects and advantages of the invention will become apparent upon reading the following detailed description and upon reference to the accompanying drawings in which:

FIG. 4A through FIG. 4K shows schematic cross sectional views of the building structures at various stages of the fabrication method according to a second embodiment of the present invention.

DETAILED DESCRIPTION OF THE PREFERRED EMBODIMENTS

The present invention will now be described by way of preferred embodiments with references to the accompanying drawings. Like numerals refer to corresponding parts of various drawings. Please note well-known circuits, structures and techniques may not be shown in detail in order not to obscure the aspects of the disclosure. Various embodiments will be disclosed herein. However, it is to be understood that the disclosed embodiments are only used as an illustration that can be embodied in various forms. In addition, each of the examples given in connection with the various embodiments are intended to be illustrative but not limiting to. Further, the figures are not necessarily conform to the sizes and dimension ratios of actual structures, and some features are magnified to show details of particular components (and any dimensions, materials, and similar details shown in the figures are intended to be illustrative and not limiting to). Therefore, the particular structural and functional details are disclosed herein are not interpreted as limitations, but are used only to teach those skilled in the relevant field technicians to practice the basis of the disclosed embodiments.

Figure 1:
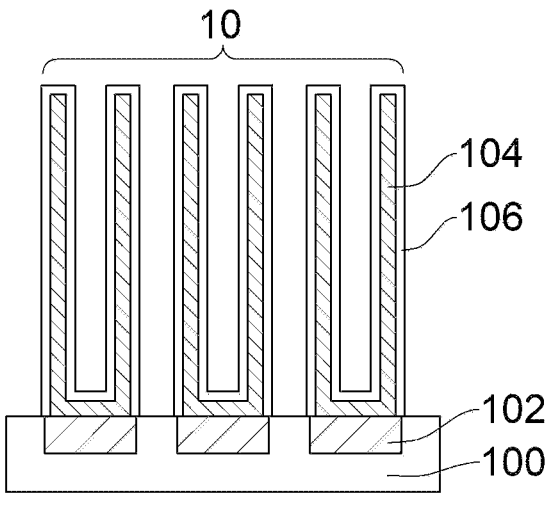
FIG. 1 is a schematic cross sectional view of a partially produced structure of crown capacitors by the conventional fabrication method.
Figure 2:
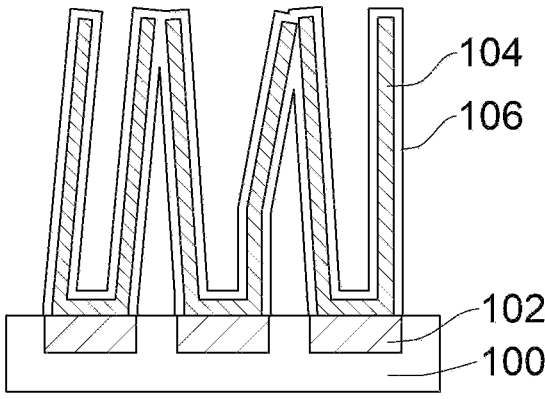
FIG. 2 is a schematic cross sectional view of a partially produced structure of crown capacitors by the conventional fabrication method, showing the phenomenon of the bottom electrodes' bending to abut each other during the fabrication process.
Figure 3A:
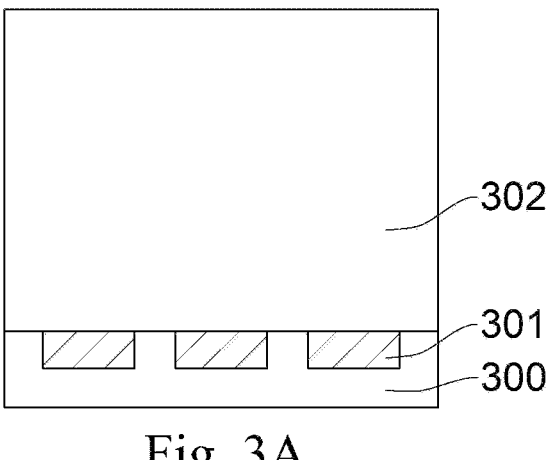
FIG. 3A through FIG. 3K shows schematic cross sectional views of the building structures at various stages of the fabrication method according to a first embodiment of the present invention.
Figure 3B:
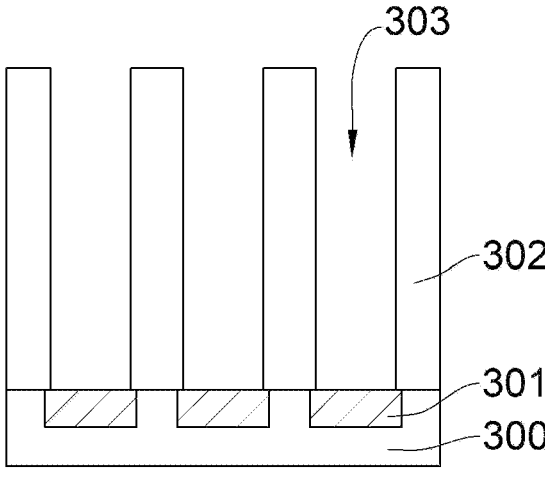
Figure 3C:
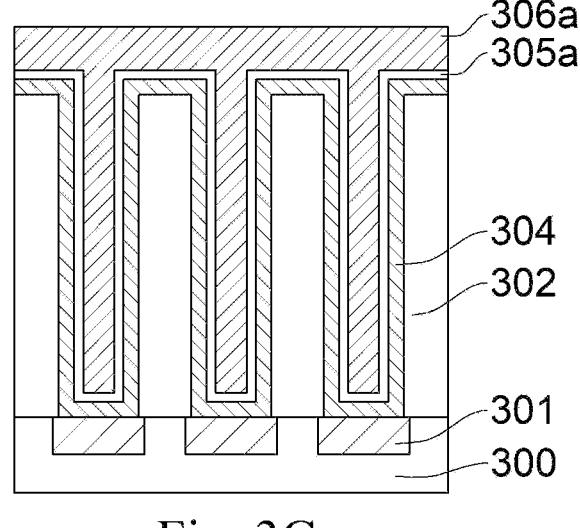
Figure 3D:
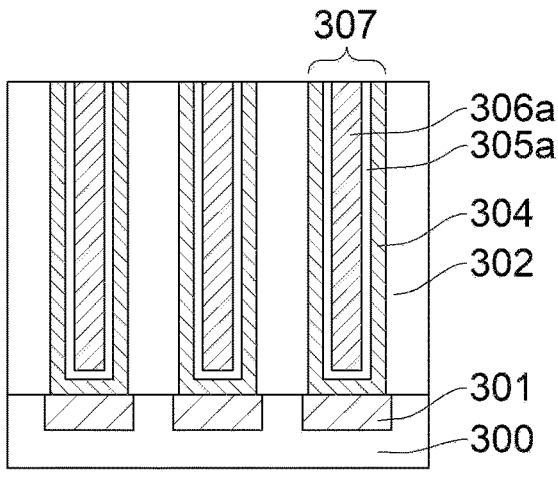
Figure 3E:
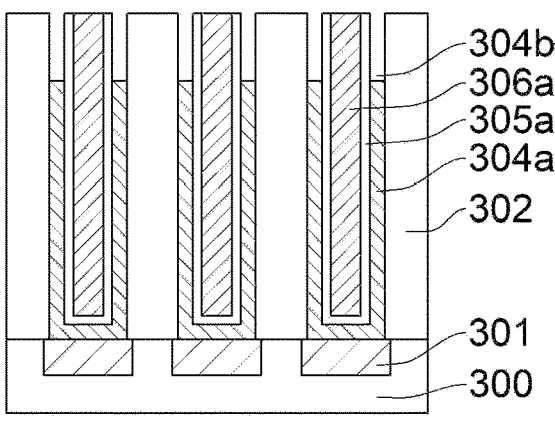
Figure 3F:
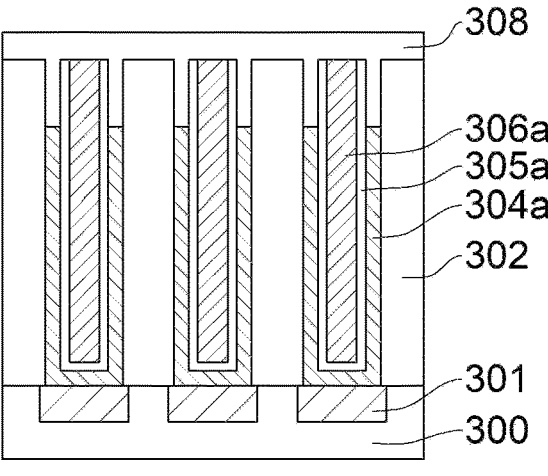
Figure 3G:
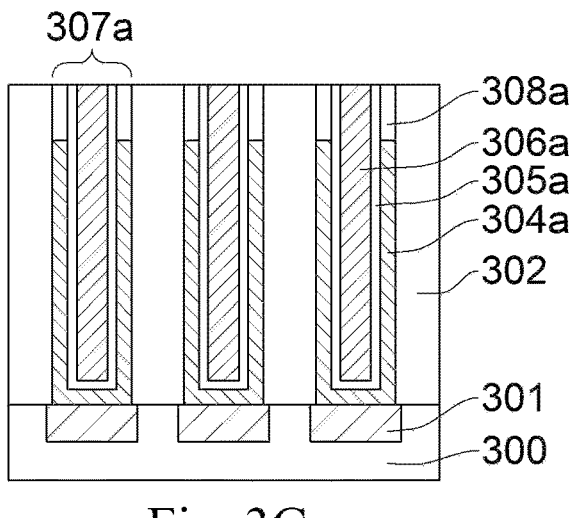

FIG. 3A through FIG. 3K depict a processing sequence for fabricating a capacitor structure, which may be as crown capacitors for DRAM memory cells, according to a first embodiment of the present invention. Initially, as shown in FIG. 3A, a substrate 300 having an array of conductive landing pads 301 is provided. A first dielectric layer 302 is formed on the substrate 300. For example, a silicon oxide layer (SiO$_2$) may be deposited on the substrate 300 as the first dielectric layer 302. Then, as shown in FIG. 3B, a plurality of trenches 303 is formed in the first dielectric layer 302 to expose the conductive landing pads 301, and each of the trenches 303 is aligned over one of the conductive landing pads 301. The trenches 303 may be formed by a photolithography and etching process. See FIG. 3C, a bottom electrode layer 304 is conformally deposited on the first dielectric layer 302, for example a titanium nitride (TiN) film may be deposited on the first dielectric layer 302 to provide the conformal bottom electrode layer 304. Then, a first capacitor dielectric layer 305a to be served as capacitor dielectric of an inner capacitor of a resulted crown capacitor produced by the fabrication method according to the first embodiment is conformally formed on the bottom electrode layer 304. Then, a first top electrode layer 306a to be served as a top electrode of the inner capacitor of the resulted crown capacitor is formed on the first capacitor dielectric layer 305a such that the first capacitor dielectric layer 305a is interposed between the bottom electrode layer 304 and the first top electrode layer 306a. For example, a polysilicon layer may be deposited on the first capacitor dielectric layer 305a to form the conformal first top electrode layer 306a. Turning to FIG. 3D, a first chemical mechanical polish (CMP) process is performed until the first dielectric layer 302, the bottom electrode layer 304, the first capacitor dielectric layer 305a and the first top electrode layer 306a are coplanar, whereby an array of inner capacitor predecessors 307 are provided and each of the inner capacitor predecessors 307 is aligned over one of the conductive landing pads 301, and each of the inner capacitor predecessors 307 comprises the bottom electrode layer 304, the first top electrode layer 306a and the first capacitor dielectric layer 305a interposed between the bottom electrode layer 304 and the first top electrode layer 306a. Then, turning to FIG. 3E, a portion of the bottom electrode layer 304 is removed, for example, by an anisotropic etching process, to form an array of bottom electrodes 304a and an array of recesses 304b aligned over the bottom electrodes 304a. Subsequently, a cap dielectric layer 308 is formed to fill the recesses 304b, as shown in FIG. 3F. For example, a silicon nitride layer may be deposited as the cap dielectric layer 308 to fill the recesses 304*b*. Then, in FIG. 3G, a second chemical mechanical polish process is performed until the first dielectric layer 302, the first capacitor dielectric layer 305*a*, the first top electrode layer 306*a* and the cap dielectric layer 308 are coplanar. Until now, an array of cylinder-type solid inner capacitors 307*a* are provided, each of the inner capacitors 307*a* includes a first capacitor dielectric layer 305*a* interposed between the first top electrode 306*a* and the bottom electrode 304*a* with a cap dielectric 308*a* on one end of the bottom electrode 304*a* opposing the conductive landing pad 301.

Figure 3H:
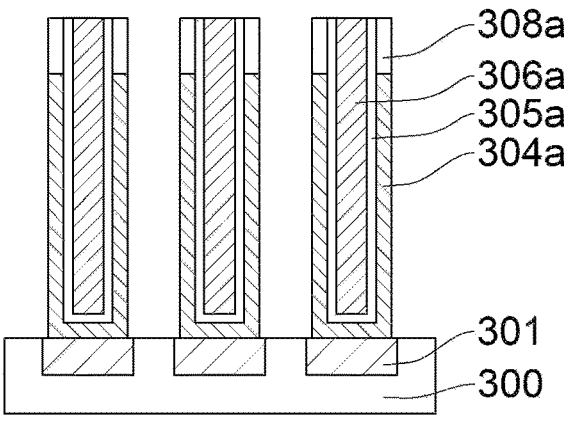
Figure 3I:
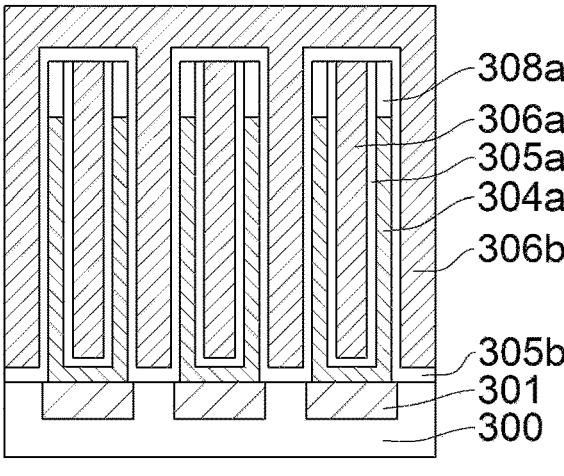
Figure 3J:
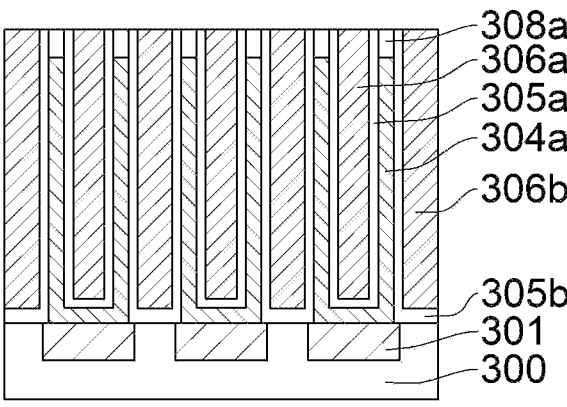
Figure 3K:
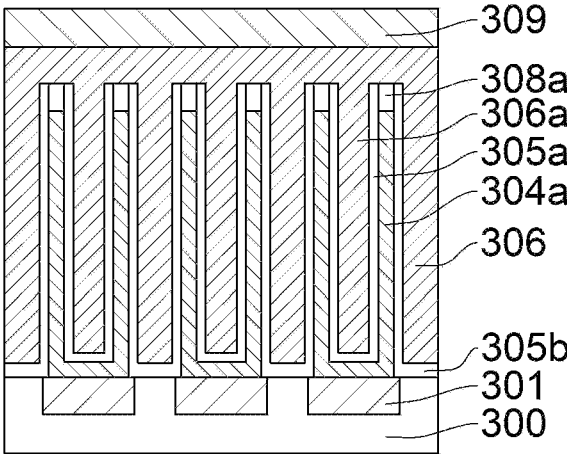

Subsequently, referring to FIG. 3H, the first dielectric layer 302 is removed so that the cylinder type solid inner capacitors 307*a* are freestanding on the substrate 300. The cylinder type solid inner capacitor 307*a* would strengthen the structure itself to support its own weight and to prevent the bottom electrodes 304*a* from bending and/or falling during the subsequent fabrication process. Then, as shown in FIG. 3I, a second capacitor dielectric layer 305*b* is conformally formed on the inner capacitors 307*a*. For example, the second capacitor dielectric layer 305*b* is deposited with the same material of the first capacitor dielectric layer 305*a*. A second top electrode layer 306*b* is formed on the second capacitor dielectric layer 305*b* so that the second capacitor dielectric layer 305*b* is interposed between the second top electrode layer 306*b* and the bottom electrode 304*a*. See FIG. 3J, a third chemical mechanical polish process is performed until the first top electrode layer 306*a*, the second top electrode layer 306*b*, the cap dielectric 308*a*, the first capacitor dielectric layer 305*a* and the second capacitor dielectric layer 305*b* are coplanar so as to form an array of outer capacitors, each of the outer capacitors has the second capacitor dielectric layer 305*b* interposed between the bottom electrode 304*a* and the second top electrode 306*a*. Until now, an array of crown capacitors is provided, each of the crown capacitors comprises one of the outer capacitors around one of the cylinder-type solid inner capacitors. The cap dielectric 308*a* divides the inner capacitor and the outer capacitors for the crown capacitor. At last, see FIG. 3K, a conductive layer with the same material as the first top electrode 306*a* and the second top electrode 306*b* may be formed over the crown capacitors to form a common top electrode 306. For example, a polysilicon layer may be deposited over the crown capacitors. Then, a top electrode metal layer 309 may be provided on the common top electrode 306. An array of crown capacitors may be served for individual DRAM cells is provided.

Figures 4H, 4I:
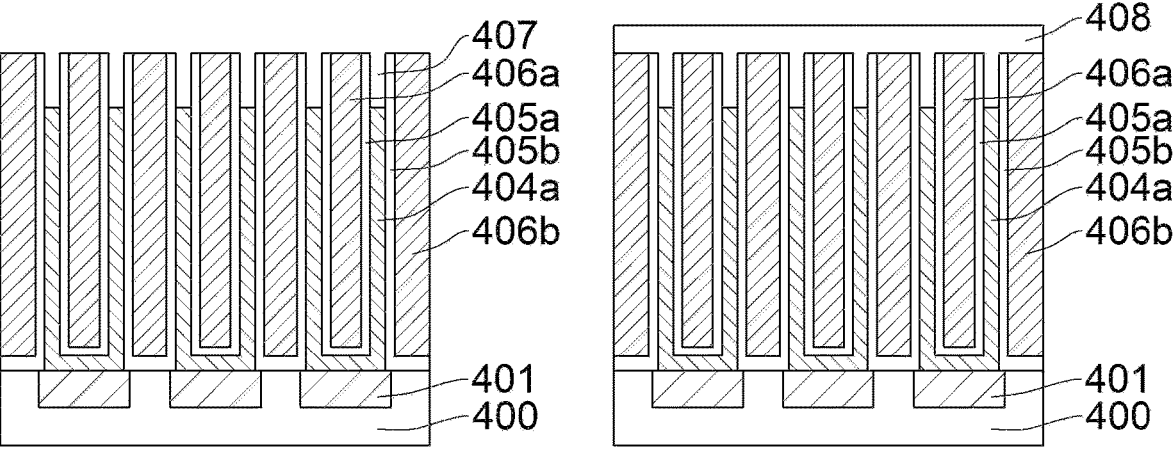

A second embodiment for fabricating the crown capacitors of the present invention is embodied in FIG. 4A through FIG. 4K. In the second embodiment, an array of cylinder-type solid inner capacitor predecessors are provided at first as the first embodiment. The process sequence of FIG. 4A through FIG. 4D are similar to the process sequence of FIG. 3A through FIG. 3D. So, in FIG. 4A, a substrate 400 having an array of conductive landing pads 401 is provided. A first dielectric layer 402 is formed on the substrate 400. For example, a silicon oxide layer ($SiO_2$) may be deposited on the substrate 400 as the first dielectric layer 402. Then, as shown in FIG. 4B, a plurality of trenches 403 is formed in the first dielectric layer 402 to expose the conductive landing pads 401, and each of the trenches 403 is aligned over one of the conductive landing pads 401. The trenches 403 may be formed by a photolithography and etching process. See FIG. 4C, a bottom electrode layer 404 is conformally deposited on the first dielectric layer 402, for example a titanium nitride (TiN) film may be deposited on the first dielectric layer 402 to provide the conformal bottom electrode layer 404. Then, a first capacitor dielectric layer 405*a* to be served as capacitor dielectric of an inner capacitor of a resulted crown capacitor produced by the fabrication method according to the second embodiment is conformally formed on the bottom electrode layer 404. Then, a first top electrode layer 406*a* to be served as a top electrode of the inner capacitor of the resulted crown capacitor is formed on the first capacitor dielectric layer 405*a* such that the first capacitor dielectric layer 405*a* is interposed between the bottom electrode layer 404 and the first top electrode layer 406*a*. For example, a polysilicon layer may be deposited on the first capacitor dielectric layer 405*a* to form the first top electrode layer 406*a*. Turning to FIG. 4D, a first chemical mechanical polish (CMP) process is performed until the first dielectric layer 402, the bottom electrode layer 404, the first capacitor dielectric layer 405*a* and the first top electrode layer 406*a* are coplanar, whereby an array of cylinder-type solid inner capacitor predecessors are provided and each of the inner capacitor predecessors is aligned over one of the conductive landing pads 401, and each of the inner capacitor predecessors 407 comprises the bottom electrode layer 404, the first top electrode layer 406*a* and the first capacitor dielectric layer 405*a* interposed between the bottom electrode layer 404 and the first top electrode layer 406*a*.

Figures 4J, 4K:
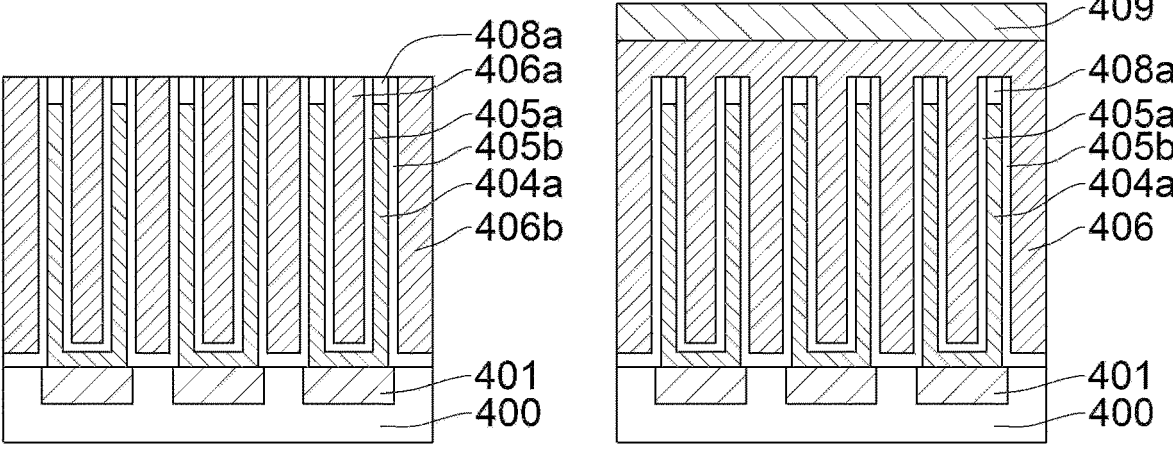

Subsequently, referring to FIG. 4E, the first dielectric layer 402 is removed so that the cylinder-type solid inner capacitor predecessors are freestanding on the substrate. The cylinder-type solid inner capacitor predecessors would strengthen the structure themselves to support their own weight and to prevent the bottom electrode layer 404 which is in form of individual trenches with thin sidewalls from bending and/or falling during the subsequent fabrication process. Continually, as shown in FIG. 4F, a second capacitor dielectric layer 405*b* is conformally formed on the inner capacitor predecessors. For example, the second capacitor dielectric layer 405*b* is deposited with the same material of the first capacitor dielectric layer 405*a*. A second top electrode layer 406*b* is formed on the second capacitor dielectric layer 405*b* so that the second capacitor dielectric layer 405*b* is interposed between the second top electrode layer 406*b* and the bottom electrode layer 404. Then, turning to FIG. 4G, a second chemical mechanical polish process is performed until the first top electrode layer 406*a*, the second top electrode layer 406*b*, the first capacitor dielectric layer 405*a* and the second capacitor dielectric layer 405*b* are coplanar. Afterward, see FIG. 4H, a portion of the bottom electrode layer 404 is removed to form an array of bottom electrodes 404*a* and an array of recesses 407 aligned over the bottom electrodes 404*a*. The recesses 407 may be formed by an anisotropic etching process. Then, referring to FIG. 4I, a cap dielectric layer 408 is formed to fill the recesses 407. The cap dielectric layer 408 may be formed by deposition with silicon nitride. Thereafter, see FIG. 4J, a third chemical mechanical process is performed until the first top electrode layer 406*a*, the second top electrode layer 406*b*, the first capacitor dielectric layer 405*a*, the second capacitor dielectric layer 405*b* and the cap dielectric layer 408 are coplanar so that an array of crown capacitors are provided, each of the crown capacitors comprises an outer capacitor around one of an inner capacitor, the outer capacitor has the second capacitor dielectric layer 405*b* interposed between the second top electrode layer 406*b* and the bottom electrode 404*a*, the inner capacitor has the first capacitor dielectric layer 405*a* interposed between the first top electrode layer 406*a* and the bottom electrode 404*a*, and a cap dielectric 408*a* is provided at one end of the bottom electrode 404*a* opposing the conductive landing pad 401. Until now, an array of crown capacitors is provided, each of the crown capacitors comprises one of the outer capacitors around one of the cylinder-type solid inner capacitors. The cap dielectric 408a divides the inner capacitor and the outer capacitors for the crown capacitor. Finally, as shown in FIG. 4K, a conductive layer with the same material as the first top electrode 406a and the second top electrode 406b may be formed over the crown capacitors to form a common top electrode 406. For example, a polysilicon layer may be deposited over the crown capacitors. Then, a top electrode metal layer 409 may be provided on the common top electrode 406. An array of crown capacitors may be served for individual DRAM cells is provided.

The present invention addresses the problem that the building structure may bend and/or fall during the fabrication of the crown capacitors so that the size of the capacitors in diameter can be easily reduced to further make the DRAM cells smaller. Also, the capacitor can be made taller to gain more surface area for each of individual crown capacitors to enlarge its capacitance without the fear of its bending or falling. The fabrication method of the present crown capacitors may continue to shrink the DRAM cell size and advance DRAM manufacture.

The above-mentioned embodiments of the present invention are exemplary and not intended to limit the scope of the present invention. Various variation or modifications made without departing from the spirit of the present invention and achieving equivalent effects shall fall within the scope of claims of the present invention.

What is claimed is:

1. A capacitor structure having an inner solid cylindrical capacitor and an outer capacitor surrounding the inner solid cylindrical capacitor, comprising:

a U-shaped bottom electrode having two spaced vertical legs and a base connected with the two vertical legs, each of the vertical legs having a cap dielectric disposed on its one end away from the base;

a capacitor dielectric layer conformally formed on sidewall surfaces of the vertical legs of the bottom electrode and a surface of the base of the bottom electrode facing the cap dielectric as well as sidewall surfaces of the cap dielectric with uncovering a top of the cap dielectric away from the vertical leg; and a top electrode interdigitating with the vertical legs of the U-shaped bottom electrode and covering the capacitor dielectric layer and the top of the cap dielectric so that the capacitor dielectric layer is interposed between the top electrode and the bottom electrode, and the cap dielectric divides the inner solid cylindrical capacitor and the outer capacitor.

2. The capacitor structure of claim 1, wherein the cap dielectric comprising silicon nitride (SiN).

3. The capacitor structure of claim 1, wherein the bottom electrode comprises titanium nitride (TiN).

4. The capacitor structure of claim 1, wherein the top electrode comprises polysilicon material.

5. A capacitor structure for DRAM with crown capacitors, comprising:

an array of capacitor cells, each of the capacitor cells is configured to a capacitor structure as claimed in claim 1.

6. The capacitor structure for DRAM with crown capacitors of claim 5, wherein the capacitor cells share a common top electrode.

7. The capacitor structure for DRAM with crown capacitors of claim 5, wherein each of the capacitor cells has its individual bottom electrode.

* * * * *